(12) United States Patent
Jasper et al.

(10) Patent No.: US 8,168,537 B2
(45) Date of Patent: May 1, 2012

(54) SEMICONDUCTOR COMPONENT AND ASSUMBLY WITH PROJECTING ELECTRODE

(75) Inventors: Joerg Jasper, Hamburg (DE); Ute Jasper, Tschugg (DE)

(73) Assignee: NXP B.V., Eindhoven (NL)

( * ) Notice: Subject to any disclaimer, the term of this patent is extended or adjusted under 35 U.S.C. 154(b) by 398 days.

(21) Appl. No.: 12/377,726

(22) PCT Filed: Aug. 13, 2007

(86) PCT No.: PCT/IB2007/053208
§ 371 (c)(1),
(2), (4) Date: Apr. 8, 2009

(87) PCT Pub. No.: WO2008/020392
PCT Pub. Date: Feb. 21, 2008

(65) Prior Publication Data
US 2010/0289149 A1 Nov. 18, 2010

(30) Foreign Application Priority Data
Aug. 17, 2006 (EP) .................... 06119085

(51) Int. Cl.
*H01L 21/44* (2006.01)
(52) U.S. Cl. ........ 438/674; 438/670; 438/118; 438/121; 438/675; 257/687; 257/E21.171
(58) Field of Classification Search .......... 438/674, 438/670, 118, 121, 675; 257/687, E21.171
See application file for complete search history.

(56) References Cited

U.S. PATENT DOCUMENTS

| | | | |
|---|---|---|---|
| 5,545,589 A | 8/1996 | Tomura et al. | |
| 5,574,311 A * | 11/1996 | Matsuda | 257/697 |
| 5,805,426 A | 9/1998 | Merritt et al. | |
| 6,088,236 A | 7/2000 | Tomura et al. | |
| 6,959,856 B2 | 11/2005 | Oh et al. | |
| 6,995,474 B1 | 2/2006 | Ho et al. | |
| 2001/0036063 A1* | 11/2001 | Nagaya et al. | 361/729 |
| 2004/0166660 A1 | 8/2004 | Yamaguchi | |
| 2004/0195686 A1* | 10/2004 | Jobetto et al. | 257/734 |
| 2005/0062169 A1* | 3/2005 | Dubin et al. | 257/779 |
| 2006/0151870 A1* | 7/2006 | Nishiyama et al. | 257/700 |

FOREIGN PATENT DOCUMENTS

| | | |
|---|---|---|
| EP | 0551382 B1 | 12/2001 |
| JP | 2004 087575 | 3/2004 |
| JP | 2005 026492 | 1/2005 |

* cited by examiner

*Primary Examiner* — Kimberly Nguyen
*Assistant Examiner* — Maria Ligai

(57) ABSTRACT

A semiconductor component has a substrate and a projecting electrode on the substrate. The projecting electrode is configured suitably for electrically and mechanically connecting the semiconductor component to an external substrate. Furthermore, the projecting electrode is formed by a one-dimensional or two-dimensional array of projecting sub-electrodes, which are separated from each other by an electrically insulating fluid beginning from a substrate surface. The semiconductor component has an improved projecting-electrode. It provides the projecting electrode with a sub-structure, which achieves sufficient flexibility without introducing much constructive complexity and processing complexity during fabrication.

3 Claims, 5 Drawing Sheets

SEMICONDUCTOR COMPONENT AND ASSUMBLY WITH PROJECTING ELECTRODE

FIELD OF THE INVENTION

The present invention relates to a semiconductor component having a substrate and a projecting electrode on the substrate configured suitably for electrically and mechanically connecting the semiconductor component to an external substrate.

The present invention further relates to an assembly of a semiconductor component with an external substrate, herein referred to as component-external-substrate assembly, comprising a semiconductor component and an external substrate. It also relates to a method for fabricating a semiconductor component, and to a method for fabricating a component-external-substrate assembly.

BACKGROUND OF THE INVENTION

For mounting a semiconductor component, such as a chip comprising integrated circuitry, on an external substrate, such as a circuit board, it is a well-know technique to bond the semiconductor component to the external substrate by means of projecting electrodes on an internal substrate of the semiconductor component. The projecting electrodes often take the form of bumps. Note that the internal substrate of the semiconductor component will hereinafter be referred to in short as "substrate" while the external substrate will always be referred to as the "external substrate" without abbreviation.

Mechanical stress between the projecting electrode and the substrate or, in a component-external-substrate assembly, also between the projecting electrode and the external substrate can be caused by differences between the coefficients of thermal expansion of the component and of the external substrate. For the component is typically based on silicon and further comprises layers of metal and layers made of insulators, while the external substrate is often made of an organic material, exhibiting a different behavior during temperature changes. Such mechanical stress due to a difference in thermal expansion coefficients can produce a crack of an isolation layer on the substrate of the semiconductor component, a delamination of layers, or even a breakout of silicon. On the side of the external substrate, a delamination of films arranged on the circuit board has been observed due to exerted mechanical stress.

U.S. Pat. No. 6,995,474 B1 describes an assembly of a semiconductor component with an external substrate that comprises a semiconductor component in the form of a liquid crystal display device. As shown in FIG. 6 of U.S. Pat. No. 6,995,474 B1, the device has an integrated circuit on a substrate and a projecting electrode that mechanically and electrically connects the substrate to an external glass substrate to form a chip-on-glass (COG) assembly. In order to provide the projecting electrode as a flexible bump for stress compensation, a projecting electrode has conductive pellets contacting the external glass substrate and covered by a conductive connection part in the form of a plate. The conductive connection part is connected with the substrate that contains the integrated circuit by a structure that comprises conductive parts in the form of posts embedded into an insulation layer, which is for instance a polyimide. A projecting electrode can contain a one-dimensional or two-dimensional array of posts embedded in the insulation layer, as disclosed by FIGS. 9-17 of U.S. Pat. No. 6,995,474 B1. A stress compensation is enabled by a combination of the flexible insulating material between the posts, such as polyimide, and the pellets, which allow some sliding motion of the connection part on top to compensate mechanical stress.

The structure of the projecting electrode disclosed in U.S. Pat. No. 6,995,474 B1 is rather complex. This increases the process complexity during fabrication of the projecting electrode and therefore the cost of the semiconductor component as well as the cost of the component-external-substrate assembly.

SUMMARY OF THE INVENTION

According to a first aspect of the invention, a semiconductor component is provided, which has a substrate and a projecting electrode on the substrate. The projecting electrode is configured suitably for electrically and mechanically connecting the semiconductor component to an external substrate. Furthermore, the projecting electrode is formed by a one-dimensional or two-dimensional array of projecting sub-electrodes, which are separated from each other by an electrically insulating fluid beginning from a substrate surface.

The semiconductor component of the present invention has an improved projecting-electrode structure by providing the projecting electrode with a sub-structure, which achieves mechanical flexibility without introducing much constructive complexity and processing complexity during fabrication. The sub-structure of the projecting electrode is formed by a one-dimensional or two-dimensional array of projecting sub-electrodes, which are separated from each other by an electrically insulating fluid beginning from a substrate surface, i.e., beginning at the substrate surface and extending up to the distant sub-electrode end that faces an external substrate in a component-external-substrate assembly.

The electrically insulating fluid, which is present in spaces that separate the sub-electrodes from each other allows, a deformation of the sub-electrodes. A gaseous or liquid fluid in the space between the projecting sub-electrodes has a particularly low resistance against a stress-compensating deformation of individual sub-electrodes.

Embodiments of the projecting electrode can be represented by an imaginary envelope structure, which is formed by the outer shape of the array of separate sub-electrodes as a whole. In other words, the shape and arrangement of the array of sub-electrodes define an outline of the projecting electrode. In that aspect, the semiconductor component of the invention turns away from the wide-spread perception that a projecting electrode has to be a contiguous constructive element.

The processing complexity for fabricating the semiconductor component of the present aspect of the invention is particularly low. In comparison with the fabrication of a projecting electrode that does not have a sub-structure in the form of sub-electrodes, only a new mask layout is required that defines the sub-structure of the projecting electrode. Therefore, the cost introduced by providing improved flexibility of the projecting electrode in response to mechanical stress is low in comparison with prior-art solutions described above.

A one-dimensional array of sub-electrode is any arrangement of sub-electrodes that follows a straight line. A two-dimensional array of sub-electrodes is an arrangement that does not follow a straight line. For example, the arrangement of sub-electrodes may follow a curved line. Another example of a two-dimensional array of sub-electrodes is a matrix array. However, note that these examples are non-limiting.

Note that the semiconductor component of the first aspect of the invention is not restricted to either strictly one-dimensional arrays or to strictly two-dimensional arrays of sub-electrodes. A combination is possible. An example is a projecting electrode, that has both, a one dimensional and a two-dimensional array of sub-electrodes is one that has a linear arrangement of sub-electrodes in one region, and a matrix-like array of sub-electrodes in another region.

According to a second aspect of the invention, a component-external-substrate assembly is provided that comprises the semiconductor component of the first aspect of the invention, which is connected to an external substrate through the projecting electrode.

The component-external-substrate assembly shares the advantages of the semiconductor component of the first aspect of the invention.

According to a third aspect of the invention, another component-external-substrate assembly is provided. The component-external-substrate assembly includes a semiconductor component with a substrate and a projecting electrode on the substrate configured suitably for electrically and mechanically connecting the semiconductor component to an external substrate. The projecting electrode is formed by a one-dimensional or two-dimensional array of projecting sub-electrodes, which are separated from each other by an electrically insulating material. The projecting electrode comprises a first fraction and a second fraction of projecting sub-electrodes. The first fraction of sub-electrodes is formed by at least one first sub-electrode, which is electrically connected to an electronic circuit element on the substrate, and the second fraction of sub-electrodes is formed by at least one second sub-electrode, which is electrically isolated from any electronic circuit element on the substrate. In the component-external-substrate assembly of the present aspect, the sub-electrodes are embedded in an electrically insulating elastic material.

The component-external-substrate assembly of the present aspect of the invention shares the advantage with the semiconductor component of the first aspect of the invention that it can be made with a low processing complexity.

The embodiment of the semiconductor component of the first aspect of the invention that corresponds to claim 3 and the corresponding embodiment of the component-external-substrate assembly of the second aspect of the invention form intermediate products for the component-external-substrate assembly of the present aspect of the invention.

Embedding the sub-electrodes in an electrically insulating elastic material provides additional protection to the projecting electrode. It supports the mechanical stability and can also protect the projecting electrode from contact with aggressive chemicals.

In the following, preferred embodiments of the semiconductor component of the first aspect of the invention as well as preferred embodiments of the component-external-substrate assembly of the second and third aspects of the invention will be described. It is understood that preferred embodiments of the semiconductor component also form preferred embodiments of the component-substrate-assemblies, which comprise the semiconductor component of the first aspect of the invention or. Furthermore, the embodiments described herein can be combined with each other, unless explicitly described as alternative embodiments.

The substrate surface can be formed by a layer that is deposited on the substrate. The substrate surface can also be formed by one layer in a first surface section and by another layer in another surface section. Different surface sections can be at different height levels.

In preferred embodiments, the fluid, which separates the sub-electrodes from each other beginning from the substrate surface is gaseous. Most embodiments advantageously use air. This embodiment has a particularly low processing complexity, since no additional steps are required for depositing the fluid. However, another gaseous or liquid fluid can be used, as long as it is electrically insulating.

In a further preferred embodiment of the semiconductor component of the first aspect of the invention and of the component-external-substrate assembly of the second aspect of the invention, the projecting electrode comprises a first fraction and a second fraction of projecting sub-electrodes. The first fraction of sub-electrodes is formed by at least one first sub-electrode, which is electrically connected to an electronic circuit element on the substrate. The second fraction of sub-electrodes is formed by at least one second sub-electrode, which is electrically isolated from any electronic circuit element on the substrate. This embodiment allows separately defining the sizes of the electrical and mechanical contact areas. This increases design flexibility and allows using the same basic design of the semiconductor component in applications, which pose different mechanical and electrical requirements on the projecting electrode. The number of sub-electrodes contained in the first and second fractions can be adapted to the specific needs without having to change the general design of the projecting electrode.

In a further embodiment, the projecting electrode is arranged above a layer structure. The layer structure forms a part of the substrate. The layer structure contains, in a direction from the substrate to the projecting electrode, a first electrically insulating bottom layer, an electrically conductive center layer, and an electrically insulating top layer. In this embodiment, the sub-electrodes are preferably seated on respective electrically conductive adhesion-layer sections, which increase the adhesion of the sub-electrodes to the substrate. Suitable adhesion-layer materials are for example Ti or TiW. The material is preferably chosen so that the adhesion layer can also serve as a diffusion barrier, to prevent diffusion of metal, e.g., gold from the electrode into the substrate. The adhesion-layer sections are in one embodiment covered by seed-layer sections, which serve to support the growth of a metal during fabrication of the sub-electrodes.

Preferred materials suitable for forming the projecting electrode and, thus, the sub-electrodes, are gold Au and copper Cu. Other examples are aluminum Al, silver Ag, platinum Pt, or nickel Ni. Generally, any conducting material that can be manufactured to the required height and shape and can be connected to the external substrate would suit.

In a further preferred embodiment, the at least one first sub-electrode contacts the center layer through an opening in the top layer, which opening has smaller lateral extensions than the first sub-electrode. This way, the contact area between the sub-electrode and the center layer can be hermetically sealed.

In some embodiments, the external substrate is rigid, as for instance a circuit board. However, in other embodiments the component-external-substrate assembly has a deformable external substrate. The present invention is for instance particularly suitable for application in a chip-on-foil (COF) or a tape-carrier-package (TCP) assembly.

According to a fourth aspect of the invention, a method for fabricating a semiconductor component according to the first aspect of the invention or one of its embodiments comprises the steps:

providing a substrate;
    depositing a resist layer on the substrate;
    fabricating a one-dimensional or two-dimensional array of openings in the resist layer, which are laterally separated from each other, thus defining shapes of a one-dimensional or two-dimensional array of sub-electrodes of a projecting electrode to be fabricated;

depositing an electrically conductive electrode material in the array of openings, thus forming the sub-electrodes of the projecting electrode;

removing the resist layer and providing an electrically insulating fluid between the sub-electrodes.

The method of the third aspect of the invention shares the previously presented advantages of the semiconductor component of the first aspect of the invention and of the component-external-substrate assembly, according to the second aspect of the invention.

In one embodiment, providing a substrate comprises:

depositing an adhesion layer and a seed layer on a layer structure that comprises on a semiconductor substrate with an integrated circuit, in a direction from the substrate to the projecting electrode, a bottom layer, a center layer, and a top layer;

depositing a seed layer on the adhesion layer.

This embodiment supports the growth of suitable metal sub-electrodes with small dimensions. The adhesion layer and the seed layer are preferably removed from substrate sections, which are not covered by the sub-electrodes, after the step of removing the resist layer.

A fifth aspect of the invention is provided by a method for forming a component-external-substrate assembly. The method comprises the steps of providing a semiconductor component according to the first aspect of the invention or one of its embodiments, and, connecting the semiconductor component to an external substrate through the projecting electrode.

The method provides a simple and flexible process platform for the fabrication of a component-external-substrate assembly. For providing a semiconductor component according to the first aspect of the invention or one of its embodiments, the method according to the fourth aspect of the invention or one of its embodiments is preferably used.

In a preferred embodiment, by which the component-external-substrate assembly of the third aspect of the invention is fabricated, the method further comprises a step of embedding the sub-electrodes into an elastic insulating material.

BRIEF DESCRIPTION OF THE DRAWINGS

Embodiments will now be explained in more detail with reference to the drawings, in which.

DETAILED DESCRIPTION OF THE EMBODIMENTS

Figure 1:
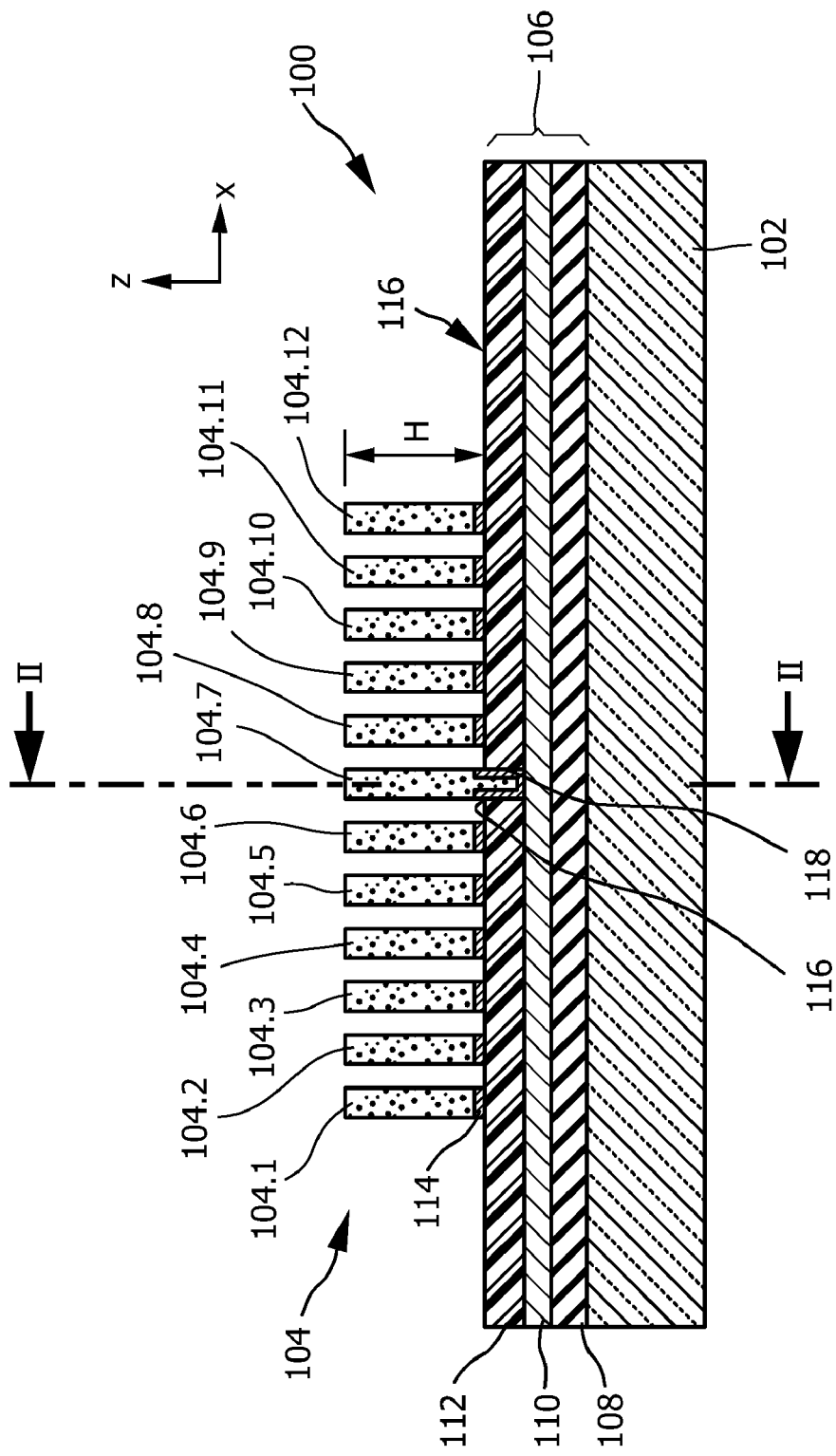
FIGS. 1 and 2 show schematic cross-sectional views of an embodiment of a semiconductor component.
Figure 2:
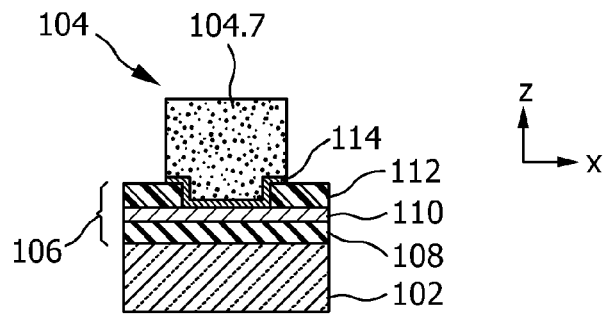
Figure 3:
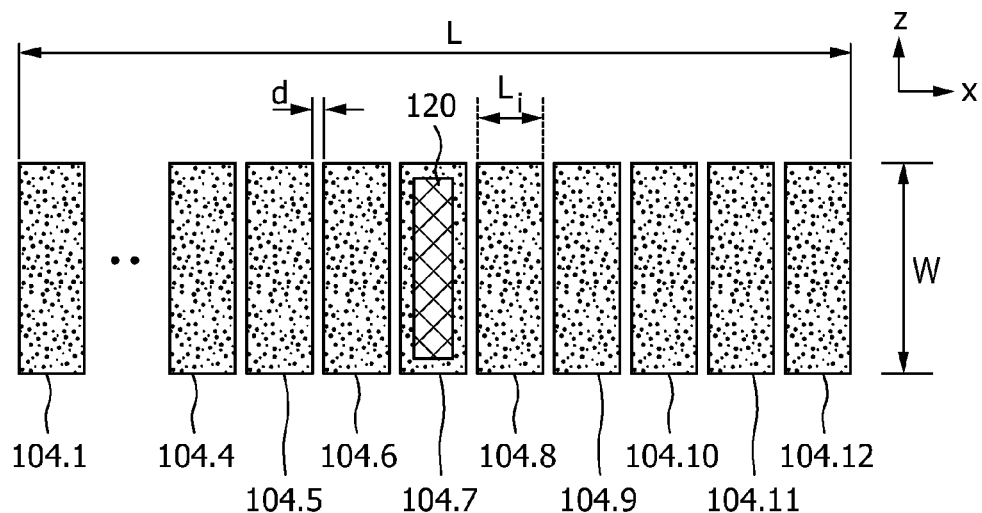
FIG. 3 shows a schematic top view of the projecting electrode 104 of FIGS. 1 and 2.

FIGS. 1 and 2 show schematic cross-sectional views of an embodiment of a semiconductor component 100. The two cross-sectional views of FIGS. 1 and 2 show sectional planes of the semiconductor component 100, which are perpendicular to each other. The sectional plane shown in FIG. 2 is indicated by a dashed line II-II in FIG. 1. FIG. 3 shows a schematic top view of the projecting electrode 104 of the semiconductor component 100 of FIGS. 1 and 2. In the following, reference is made to FIGS. 1 to 3 in parallel.

The semiconductor component 100 of FIGS. 1 and 2 has a substrate 102 and a projecting electrode 104 on the substrate 102. The substrate 102 contains integrated circuits (not shown) and is covered by a layer stack 106, which contains a bottom layer 108, which is an electrically insulating layer, a center layer 110, which is a electrically conducting layer, and a top layer 112, which again is an electrically insulating layer. The terms bottom layer, center layer and top layer are chosen with reference to the layer stack 106 and do not imply that no other layers can be present.

The bottom layer 108 can be made of Silicon dioxide or Silicon nitride. Bottom layer 108 can also be made of a deposited dielectric material, e.g., BPSG (BoroPhosphoSilicate Glass) or organic spin-on-glass (SOG) dielectric material, or a combination or sandwich of such layers.

The center layer is in the present embodiment made of a metal, for instance Aluminum containing Silicon and Copper or Aluminum containing only Silicon or only Copper.

The top layer serves for passivation and scratch protection and is made of Silicon dioxide, Silicon oxynitride, or an organic material. The top layer can also be made of silicon nitride and/or a layer sandwich of the mentioned materials.

On top of the layer structure 106, adhesion layer sections are provided, an example of which is shown by reference label 114. For simplicity, all adhesion layer sections will in the following be referred to by the reference label 114, unless explicitly The adhesion layer sections 114 are made of Titanium or TiW. However, the composition of the adhesion layer is not limited to Ti or TiW. Other possibilities are Chromium (Cr), Nickel (Ni), Vanadium (V), or Tungsten (W), or a combination of the mentioned adhesion layer materials. It should be noted that the individual adhesion-layer sections underneath the sub-electrodes are not connected with each other.

The adhesion layer sections 114 are arranged underneath sub-electrodes 104.1 to 104.12 in the form of a row with equal distances d between neighboring sub-electrodes.

The individual sub-electrodes have a common shape of upright slabs with a length L along a lateral x-direction and a width W along a lateral y-direction. They further have a height H extending from a substrate surface 116, which is in the present embodiment is the surface of the top layer 112, to a top and of the sub-electrodes. The geometrical parameters $L_i$, W and H of the individual sub-electrodes and their distance d are indicated in FIGS. 1 and 3. Note that in the graphical representation of the height parameter H in FIG. 1 the thickness of the adhesion layer 114 is included. For correctly determining the height of the sub-electrodes 104.1 to 104.12, the thickness of the adhesion layer sections 114 would have to be subtracted. However, this value is typically negligibly small. In the present embodiment, the section of the substrate surface 116 that is shown is flat, except for the opening 118. However, this is not a requirement. More openings in the top layer 112 could be provided. The individual sub-electrodes could in another embodiment also be based on different substrate surface sections, which are at different distances from the substrate 102. In the present embodiment, all sub-electrodes have the same geometrical shape and the same height, as seen in the top view of FIG. 3. Note that this is not a necessary requirement. The individual sub-electrodes can in other embodiments have different shapes. Further note that according to a particular application purpose, the heights of the sub-electrodes could also be different. This can for instance be achieved by providing top layer 112 with a non-flat surface. However, for connecting to a flat external substrate, it is preferred to provide all sub-electrodes 104.1 to 104.12 with equal heights H.

An opening 118 in top layer 112 underneath sub-electrode 104.7 allows an electrical contact between sub-electrode 104.7 and the center layer 110. The center layer 110 is structured and connected with the integrated circuit in substrate 102. This connection and structuring are not shown here.

The sub-structure of the projecting electrode 104 provides an interface for electrical and mechanical connection between the semiconductor component 100 and an external substrate. For this purpose, the projecting electrode 104 is in one embodiment sized such that the following mechanical conditions are satisfied:

a) The mechanical contact area between the projecting electrode and the external substrate is sufficient to provide a required mechanical strength for a robust assembly that can withstand pull forces, which may typically occur during handling and operation of an assembly.

b) The width W of the electrode 104 is bigger than a width of a conductive element on an external substrate, to which the semiconductor component 100 is to be connected. Such an external contact element can for instance be a Copper lead of a tape-carrier package or a Copper trace of a chip-on-foil system.

The structure of the projecting electrode 104 fulfills these conditions by providing an effective length $L_{eff}$, which is defined by $$L_{eff} = \sum_{i=1}^{n} L_i = L - (n-1) \cdot d$$

Here, i denotes a counting index, and n is the total number of sub-electrodes. All other parameters have been defined before.

The effective mechanical contact area, which is provided by the projecting electrode 104 is thus $$A_{eff} = L_{eff} \cdot W$$

The effective mechanical contact area can be adapted to the requirements of the individual application during the design of the projecting electrode by adapting one or several of the following parameters: the individual length L, the distance d between neighboring sub-electrodes in the x-direction, and the number n of sub-electrodes.

As a result, the mechanical strength of an assembly of the semiconductor component 100 with an external substrate can be made equal to that, which would be present if a single contiguous projecting electrode of comparable contact area would be used. In particular, the projecting electrode can be designed with the same overall shape, which is also called envelope herein, as a conventional contiguous projecting electrode. This can be an advantage in applications where the shape of the projecting electrode is predefined.

The electrical contact area between an integrated circuit on the substrate 102 and the projecting electrode 104, is rather small. It is defined by the extension of the opening 118 in top layer 112 underneath sub-electrode 104.7 and also indicated by a cross-hatched area 120 in FIG. 3. Thus, sub-electrode 104.7 is the only sub-electrode responsible for providing an electrical interconnect via projecting electrode 104 in the present embodiment. All other sub-electrodes 104.1 to 104.6, and 104.8 to 104.12 have a purely mechanical function, namely, providing a required mechanical stability of the projecting electrode 104 and a sufficiently stable mechanical connection to an external substrate.

The cross-hatched area 120 shown inside the rectangle representing the sub-electrode 104.7 indicates the footprint of the electrical contact of the sub-electrode 104.7 inside the opening 118. It is somewhat smaller than the length $L_i$ of the sub-electrode 104.7.

The example of the semiconductor component 100, which has only one sub-electrode that is used for electrical connection, is typical for many applications, in which a single sub-electrode is sufficient to ensure a low-ohmic electrical path across the projecting electrode. Of course, if needed, more sub-electrodes can be used for an electrical interconnection, as will be shown in FIGS. 5 to 8 below. For this purpose, a correspondingly larger number of openings would have to be provided in top layer 112.

The introduction of the sub-electrode structure allows a separation of the lateral extension of the projecting electrode from given mechanical requirements. Mechanical and reliability requirements of the projecting electrode can be independently designed without the need of a special treatment or hardware. This provides an economic advantage, as well as an advantage of quality in comparison with known structures.

The individual sub-electrodes can be made as small as the processing capability and the assembly design rules allow for. Thus, instead of providing a single contiguous projecting electrode with a length of 100 µm and a width of 25 µm, an example of a projecting electrode in a semiconductor component of the invention could is a projecting electrode that has sub-electrodes of 10 µm length $L_i$ and 25 µm width W, with 8 µm distance d provided between neighboring sub-electrodes in x-direction.

Figure 1A:
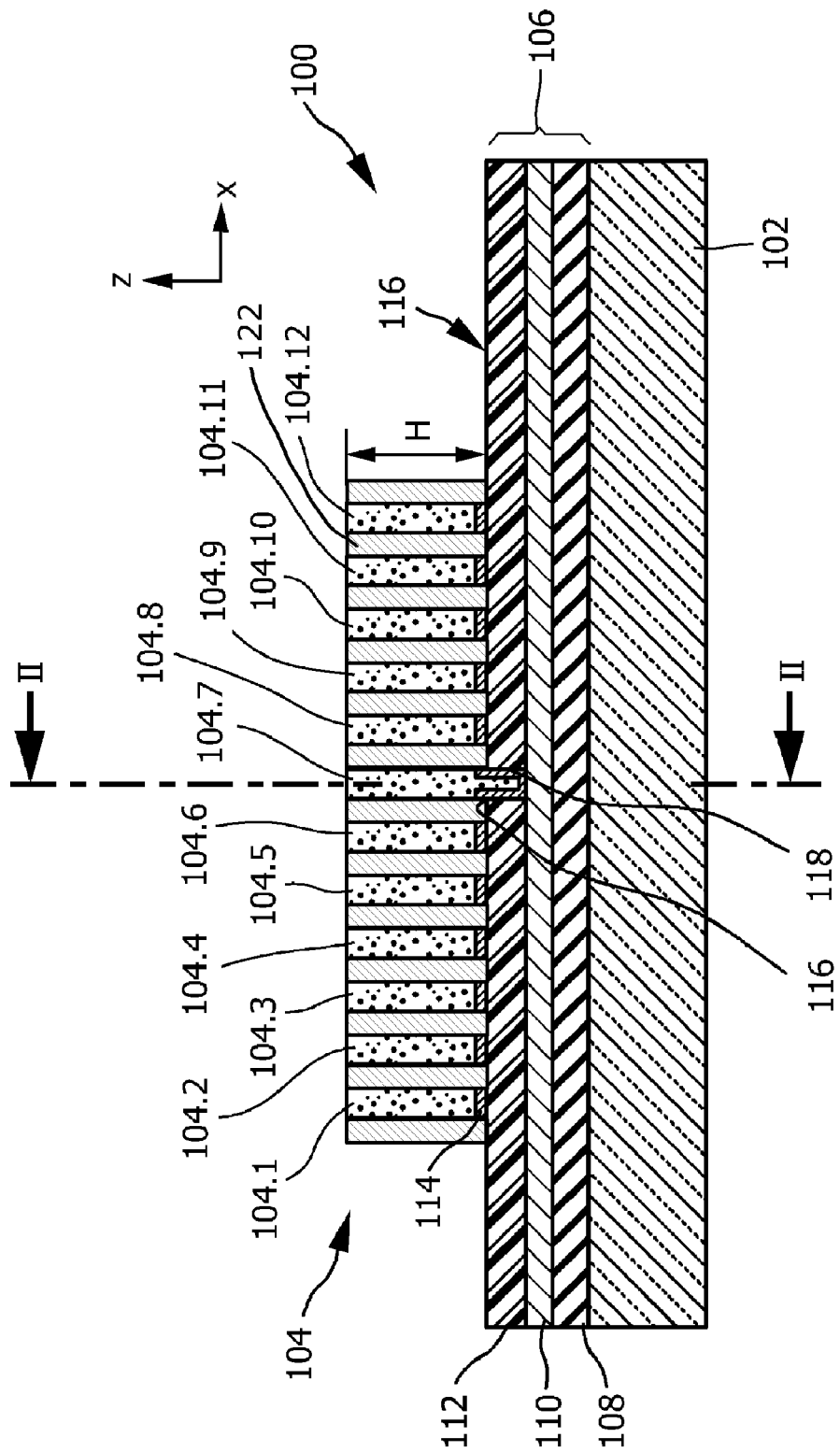
FIG. 1A shows a schematic cross-sectional view of an embodiment of a semiconductor component including sub-electrodes embedded into an elastic insulating material.

FIG. 1A shows a schematic cross-sectional view of an embodiment of a semiconductor component. Specifically, the semiconductor component of FIG. 1A includes sub-electrodes 104.1 to 104.12 embedded in an electrically insulating elastic material 122.

Figure 4:
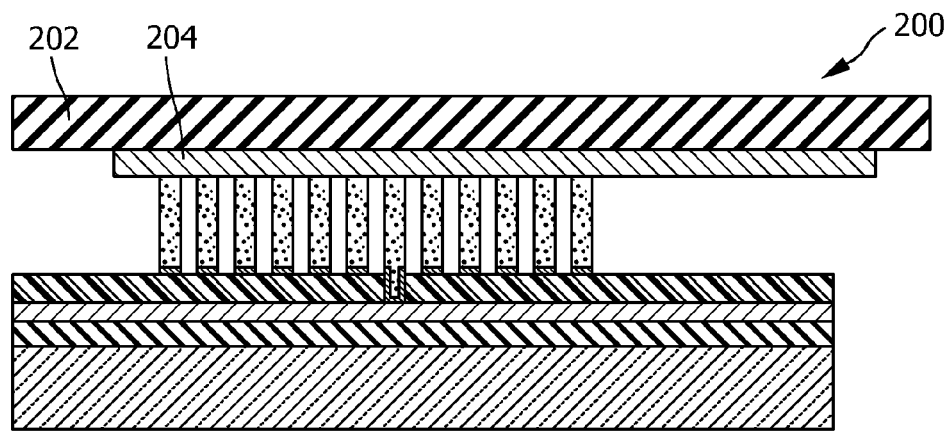
FIG. 4 shows a schematic cross-sectional view of a component-external-substrate assembly that comprises the semiconductor component of FIGS. 1 to 3.

FIG. 4 shows a schematic cross-sectional view of a component-external-substrate assembly that comprises the semiconductor component 100 of FIGS. 1 to 3. Specifically, the component-external-substrate assembly 200 of FIG. 4 comprises an external substrate 202 in the form of an organic film, which may be for instance made of a polyimide. The polyimide film carries a conductive lead or wiring, represented by reference label 204, which may be for instance made of Sn-plated Cu. The width of the lead or trace 204 is in the present embodiment smaller than the width W of the sub-electrodes of the projecting electrode 104, as explained above. However, it is also possible to have the width of the lead or trace equal to the width W of the sub-electrodes, or even larger, depending on the requirements of a particular application.

For achieving a mechanical connection, each of the sub-electrodes 104.1 to 104.12 makes a solder interconnection to the lead/trace 204. The soldering material is provided by the lead/trace on the substrate, such as for instance tin (Sn). Sn is typically uniformly distributed on a Copper trace in the form of a plating, and therefore assures a proper soldering.

In order to increase a packing density, the width W of the projecting electrode 104 and of the lead/trace can be minimized. The effective mechanical contact area of the interconnection defines the mechanical strength of the assembly, as explained in more detail the context of FIGS. 1 to 3.

Figure 5:
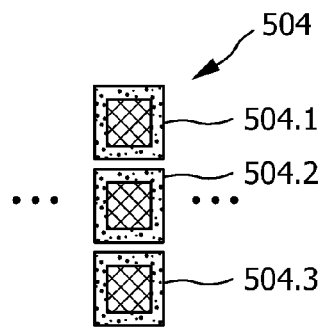
FIGS. 5-8 show schematic top views of alternative projecting-electrode structures for a semiconductor component.

FIGS. 5-8 show different alternative examples of sub-electrode structures. The graphical representation is restricted to a minimum, which is required to understand the structure. In FIG. 5, sub-electrodes 504.1 to 504.3 have the shape of square and are arranged in a two-dimensional matrix array that extends along the x- and y-directions. The sub-electrodes are arranged with a distance from each other in x- and y-directions. In y-direction, the matrix contains three sub-electrodes. The electrical connection is in the present example provided by the three sub-electrodes 504.1 to 504.3. All other sub-electrodes have purely mechanical function.

Figure 6:
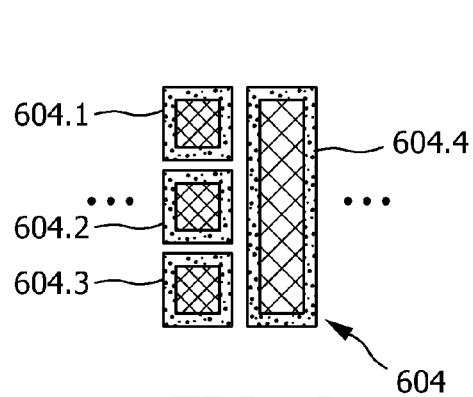

In FIG. 6, the sub-structure of the projecting electrode 604 is divided into two parts. On the left side, sub-electrodes 604.1 to 604.3 have the shape of square and are arranged in a two-dimensional matrix array that extends along the x- and y-directions. These sub-electrodes are arranged with a distance from each other in x- and y-directions. In y-direction, the matrix contains three sub-electrodes. On the right side, sub-electrode 604.4 and further sub-electrodes of identical shape are arranged in a row along the x-direction, as in the example of FIG. 3. The electrical connection is in the present example provided by the three sub-electrodes 604.1 to 604.3 and by sub-electrode 604.4. All other sub-electrodes have purely mechanical function. This embodiment is an example that combines a one-dimensional and a two-dimensional array of sub-electrodes.

Figure 7:
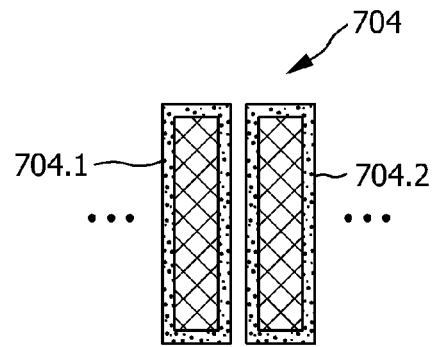

In FIG. 7, the sub-structure of the projecting electrode 704 resembles that of FIG. 3. However, electrical contact is provided by two sub-electrodes, namely, sub-electrodes 704.1 and 704.2

Figure 8:
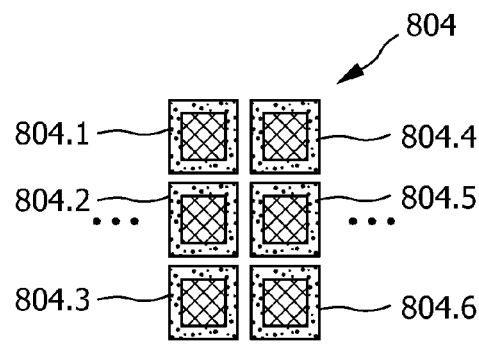

The configuration of sub-electrodes 804.1 to 804.6 of projecting electrode 804 in FIG. 8 resembles that of FIG. 5. However, electrical contact is provided by a total of 6 sub-electrodes, namely, sub-electrodes 804.1 to 804.6.

Figure 9:
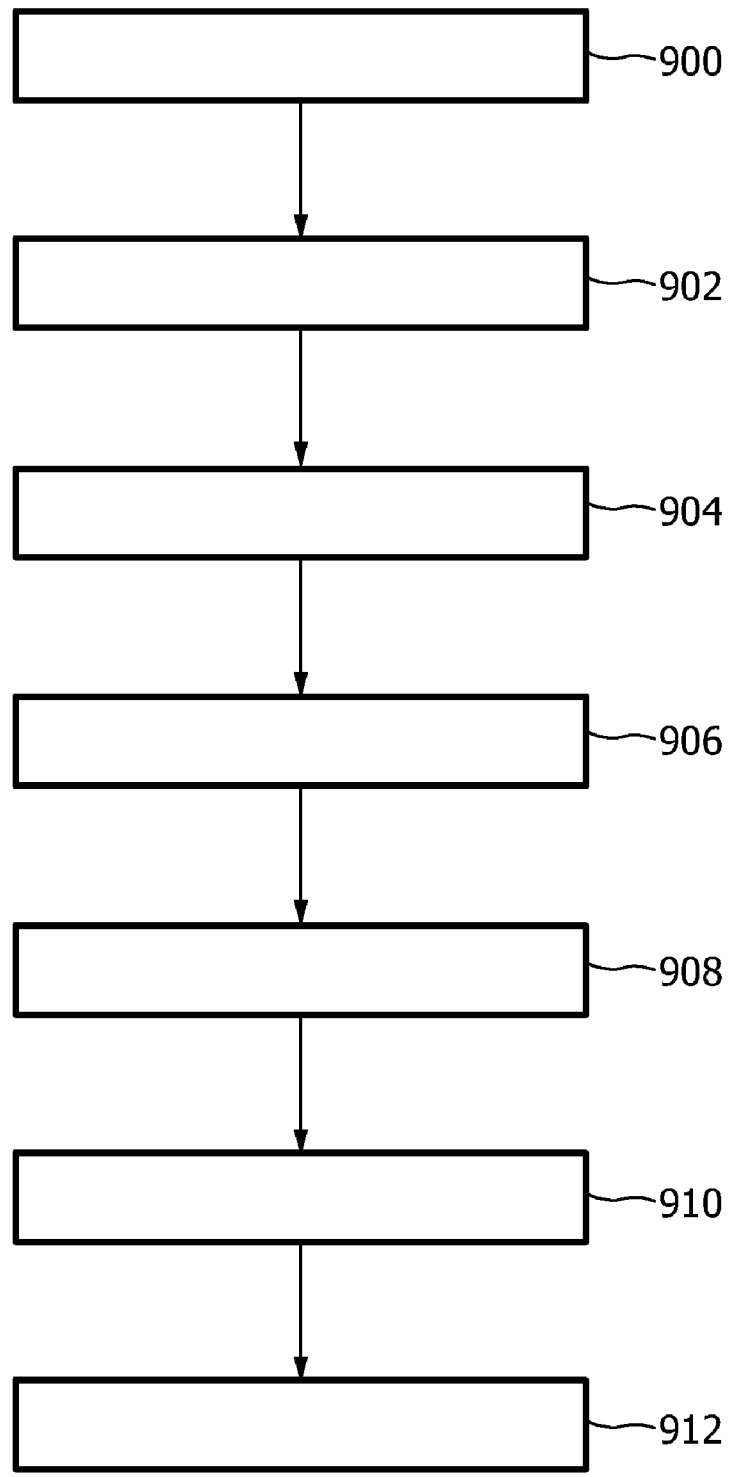
FIG. 9 is a flow diagram of a method for fabricating a component-external-substrate assembly.

FIG. 9 is a flow diagram of an embodiment of a method for fabricating a component-external-substrate assembly. The method comprises the following steps:

Step 900: providing a semiconductor substrate. In this step a substrate with an integrated circuit and with a layer structure that has a bottom layer, a center layer, and a top layer is fabricated.

Step 902: depositing an adhesion layer and a seed layer. These layers are deposited on the layer structure provided in the preceding step.

Step 904: depositing a resist layer. In this step, that starts a photolithography sequence, the whole substrate is covered with a resist layer.

Step 906: structuring the resist layer. In this step, a one-dimensional or two-dimensional array of openings is formed in the resist layer, according to a desired sub-structure of the projecting electrode. The openings are laterally separated from each other. In this step, thus, the shapes of a one-dimensional or two-dimensional array of sub-electrodes of a projecting electrode to be fabricated are defined.

Step 908: depositing metal in the openings. An electrically conductive electrode material is deposited in the array of openings, thus forming the sub-electrodes of the projecting electrode. Known materials and deposition techniques can be used.

Step 910: removing the resist, seed and adhesion layers. In this step, the resist layer is removed by known etching techniques. After that, first the seed layer and then the adhesion layer are removed from substrate sections, which are not covered by the sub-electrodes. After this step, the semiconductor component is finished and ready for further processing to form a component-external-substrate assembly.

Step 912: soldering to an external substrate. In this step, the projecting electrode is soldered to a contact element on the external substrate.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:

1. A method for fabricating a semiconductor component, comprising the steps:

providing a substrate;

depositing a resist layer on the substrate;

fabricating a one-dimensional or two-dimensional array of openings in the resist layer, which are laterally separated from each other, thus defining shapes of a one-dimensional or two-dimensional array of sub-electrodes of a projecting electrode to be fabricated, at least a first of said openings exposing an electrical connection to an electronic circuit element on the substrate and at least a second of said openings being electrically isolated from any electronic circuit element on the substrate;

depositing an electrically conductive electrode material in the array of openings, thus forming the sub-electrodes of the projecting electrode, at least one of said sub-electrodes being formed on the first of said openings and at least another one of sub-electrodes being formed on the second of said openings; and removing the resist layer and providing an electrically insulating fluid between the sub-electrodes.

2. The method of claim 1, wherein providing a substrate comprises: depositing an adhesion layer and a seed layer on a layer structure that comprises on a semiconductor substrate with an integrated circuit, in a direction from the substrate to the projecting electrode, a bottom layer a center layer, and a top layer; depositing the seed layer on the adhesion layer.

3. The method of claim 2, comprising, after the step of removing the resist layer, a step of removing the seed layer and the adhesion layer from substrate sections, which are not covered by the sub-electrodes.

* * * * *